(12) United States Patent
Barden et al.

(10) Patent No.: US 10,749,068 B2
(45) Date of Patent: Aug. 18, 2020

(54) VAPOR TRANSPORT DEPOSITION METHOD AND SYSTEM FOR MATERIAL CO-DEPOSITION

(71) Applicant: First Solar, Inc., Perrysburg, OH (US)

(72) Inventors: John Barden, Perrysburg, OH (US); Rick C. Powell, Perrysburg, OH (US)

(73) Assignee: First Solar, Inc., Tempe, AZ (US)

( * ) Notice: Subject to any disclaimer, the term of this patent is extended or adjusted under 35 U.S.C. 154(b) by 97 days.

(21) Appl. No.: 16/185,966

(22) Filed: Nov. 9, 2018

(65) Prior Publication Data

US 2019/0081199 A1    Mar. 14, 2019

Related U.S. Application Data

(60) Continuation of application No. 15/290,054, filed on Oct. 11, 2016, now Pat. No. 10,147,838, which is a division of application No. 13/671,195, filed on Nov. 7, 2012, now Pat. No. 9,490,120.

(60) Provisional application No. 61/561,691, filed on Nov. 18, 2011.

(51) Int. Cl.
| | |
|---|---|
| *C23C 16/00* | (2006.01) |
| *H01L 31/18* | (2006.01) |
| *H01L 21/02* | (2006.01) |
| *C23C 16/448* | (2006.01) |
| *C23C 14/22* | (2006.01) |
| *C23C 14/24* | (2006.01) |
| *C23C 14/56* | (2006.01) |

(Continued)

(52) U.S. Cl.
CPC ........ *H01L 31/1828* (2013.01); *C23C 14/228* (2013.01); *C23C 14/24* (2013.01); *C23C 14/243* (2013.01); *C23C 14/56* (2013.01); *C23C 16/448* (2013.01); *H01L 21/02557* (2013.01); *H01L 21/02562* (2013.01); *H01L 31/02963* (2013.01); *H01L 31/046* (2014.12); *Y02E 10/543* (2013.01); *Y02P 70/521* (2015.11)

(58) Field of Classification Search
CPC ...... C23C 16/448; C23C 16/56; C23C 16/228
See application file for complete search history.

(56) References Cited

U.S. PATENT DOCUMENTS

| | | |
|---|---|---|
| 2,138,940 A | 12/1938 | Robinson |
| 2,227,105 A | 12/1940 | Pritchard |
| 3,781,040 A | 12/1973 | Lasko et al. |

(Continued)

FOREIGN PATENT DOCUMENTS

| | | |
|---|---|---|
| CN | 101845612 A | 9/2010 |
| WO | 2010014353 A1 | 2/2010 |

OTHER PUBLICATIONS

International Preliminary Report on Patentability, dated May 20, 2014, for international application PCT/US12/63848 filed on Nov. 7, 2012, published as WO/2013/074345.

(Continued)

*Primary Examiner* — Joseph A Miller, Jr.
(74) *Attorney, Agent, or Firm* — MacMillan, Sobanski & Todd, LLC (57) ABSTRACT

An improved feeder system and method for continuous vapor transport deposition that includes at least two vaporizers couple to a common distributor through an improved seal for separately vaporizing and collecting at least any two vaporizable materials for deposition as a material layer on a substrate. Multiple vaporizer provide redundancy and allow for continuous deposition during vaporizer maintenance and repair.

20 Claims, 7 Drawing Sheets

(51) Int. Cl.
*H01L 31/046* (2014.01)
*H01L 31/0296* (2006.01)

(56) References Cited

U.S. PATENT DOCUMENTS

| | | |
|---|---|---|
| 4,249,846 A | 2/1981 | Worsham |
| 4,338,883 A | 7/1982 | Mahler |
| 4,401,052 A | 8/1983 | Baron et al. |
| 4,449,286 A | 5/1984 | Dahlberg |
| 4,702,543 A | 10/1987 | Hager |
| 4,951,601 A | 8/1990 | Maydan et al. |
| 4,987,856 A | 1/1991 | Hey et al. |
| 5,076,205 A | 12/1991 | Vowles et al. |
| 5,230,741 A | 7/1993 | Van de Ven et al. |
| 5,308,431 A | 5/1994 | Maher et al. |
| 5,614,249 A | 3/1997 | Mayeda |
| 5,855,681 A | 1/1999 | Maydan et al. |
| 5,945,163 A | 8/1999 | Powell et al. |
| 6,077,157 A | 6/2000 | Fairbaim et al. |
| 6,114,216 A | 9/2000 | Yieh et al. |
| 6,152,070 A | 11/2000 | Fairbaim et al. |
| 6,174,377 B1 | 1/2001 | Doering et al. |
| 6,210,485 B1 | 4/2001 | Zhao et al. |
| 6,270,582 B1 | 8/2001 | Rivkin et al. |
| 6,387,185 B2 | 5/2002 | Doering et al. |
| 6,818,067 B2 | 11/2004 | Doering et al. |
| 9,490,120 B2 | 11/2016 | Barden et al. |
| 10,147,838 B2 | 12/2018 | Barden et al. |
| 2001/0002279 A1 | 5/2001 | Forrest et al. |
| 2003/0213560 A1 | 11/2003 | Wang et al. |
| 2004/0069225 A1 | 4/2004 | Fairbaim et al. |
| 2004/0255857 A1 | 12/2004 | Chow et al. |
| 2005/0019504 A1 | 1/2005 | Bi et al. |
| 2006/0134347 A1 | 6/2006 | Chiruvolu et al. |
| 2006/0236937 A1 | 10/2006 | Powell et al. |
| 2006/0236940 A1 | 10/2006 | Powell et al. |
| 2007/0114440 A1 | 5/2007 | Yang |
| 2008/0014825 A1 | 1/2008 | Fukuda et al. |
| 2009/0120368 A1 | 5/2009 | Lubomirsky et al. |
| 2010/0086681 A1 | 4/2010 | Ikuta et al. |
| 2010/0098852 A1 | 4/2010 | Dieguez-Campo et al. |
| 2010/0159132 A1 | 6/2010 | Conroy et al. |
| 2010/0186812 A1 | 7/2010 | Eaglesham |
| 2011/0027462 A1 | 2/2011 | Hwang et al. |
| 2011/0177622 A1 | 7/2011 | Britt et al. |

OTHER PUBLICATIONS

Written Opinion of the International Searching Authority, dated May 18, 2014, for international application PCT/US12/63848 filed on Nov. 7, 2012, published as WO/2013/074345.
International Search Report, dated May 23, 2013, for international application PCT/US12/63848 filed on Nov. 7, 2012, published as WO/2013/074345.
First Examination Report, dated Jul. 3, 2015, Chinese patent application 201280056744.4.
Second Examination Report, dated Mar. 18, 2016, Chinese patent application 201280056744.4.
Third Examination Report, dated Sep. 14, 2016, Chinese patent application 201280056744.4.

VAPOR TRANSPORT DEPOSITION METHOD AND SYSTEM FOR MATERIAL CO-DEPOSITION

CROSS-REFERENCE

This application is a continuation application U.S. patent application Ser. No. 15/290,054, filed on Oct. 11, 2016; which is a divisional of U.S. patent application Ser. No. 13/671,195, filed on Nov. 7, 2012; which claims priority to Provisional U.S. Patent Application No. 61/561,691, filed on Nov. 18, 2011. The entire disclosures of all the aforementioned applications are incorporated by reference herein in their entirety for all purposes.

FIELD OF THE INVENTION

Disclosed embodiments relate to the field of material vapor transport deposition (VTD) methods and systems, and more particularly to a material vapor transport deposition method and system which permits continuous and controlled vaporization and deposition of powder material.

BACKGROUND OF THE INVENTION

Photovoltaic devices such as photovoltaic modules or cells, can include semiconductor and other materials deposited over a substrate using various deposition systems and techniques. One example is the deposition of a semiconductor material such as cadmium sulfide (CdS) or cadmium telluride (CdTe) thin films over a substrate using a VTD system. A VTD system may use a powder delivery unit, a powder vaporizer and vapor distributor, and a vacuum deposition unit.

VTD powder vaporizers are designed to vaporize or sublimate raw material powder into a gaseous form. In conventional powder vaporizers, raw material powder from a powder delivery unit is combined with a carrier gas and injected into a vaporizer formed as a permeable heated cylinder. The material is vaporized in the cylinder and the vaporized material diffuses through the permeable walls of the vaporizer into a vapor distributor. The distributor typically surrounds the vaporizer cylinder and directs collected vapors towards openings which face towards a substrate for thin film material deposition on the substrate.

Figure 1A:
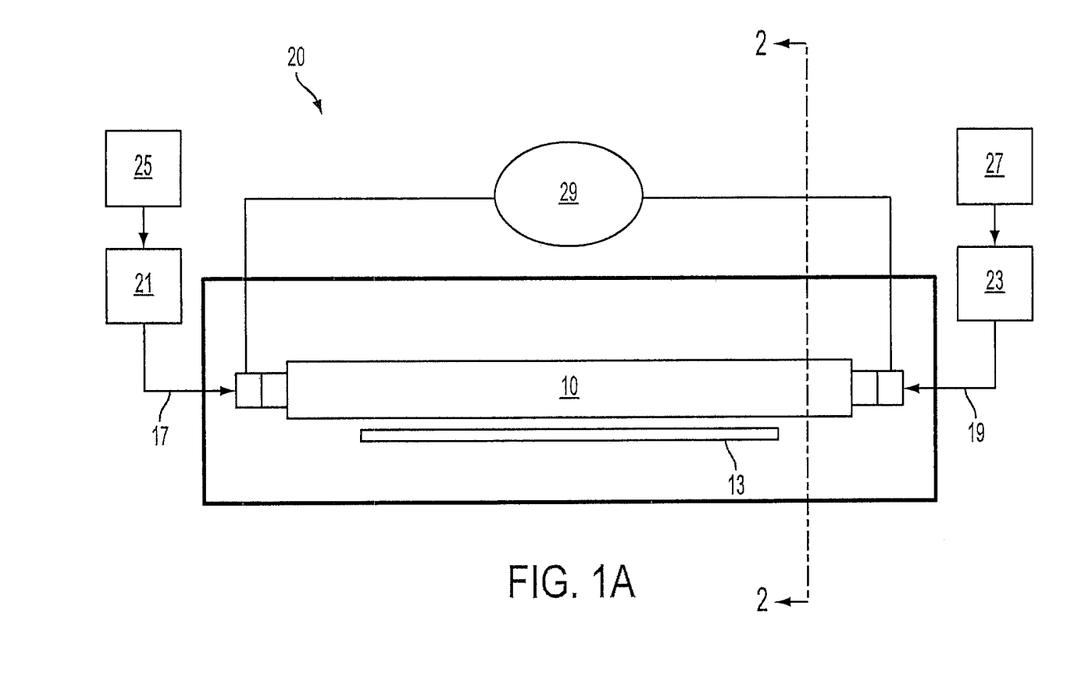
FIG. 1A is a schematic of a conventional vapor transport deposition (VTD) system.

FIG. 1A illustrates one example of a conventional vapor transport deposition system 20 for delivering and depositing a semiconductor material, for example CdS or CdTe onto a substrate 13, for example, a glass substrate 13 used in the manufacture of thin film solar modules. Inert carrier gas sources 25 and 27, for example, Helium gas (He) sources, respectively provide a carrier gas to powder feeders 21 and 23, which contain CdS or CdTe powder material. The gas transports the semiconductor material through injector ports 17, 19 on opposite ends of a vaporizer and distributor assembly 10. The vaporizer and distributor assembly 10 vaporizes the semiconductor material powder and distributes it for deposition onto substrate 13.

Figure 1B:
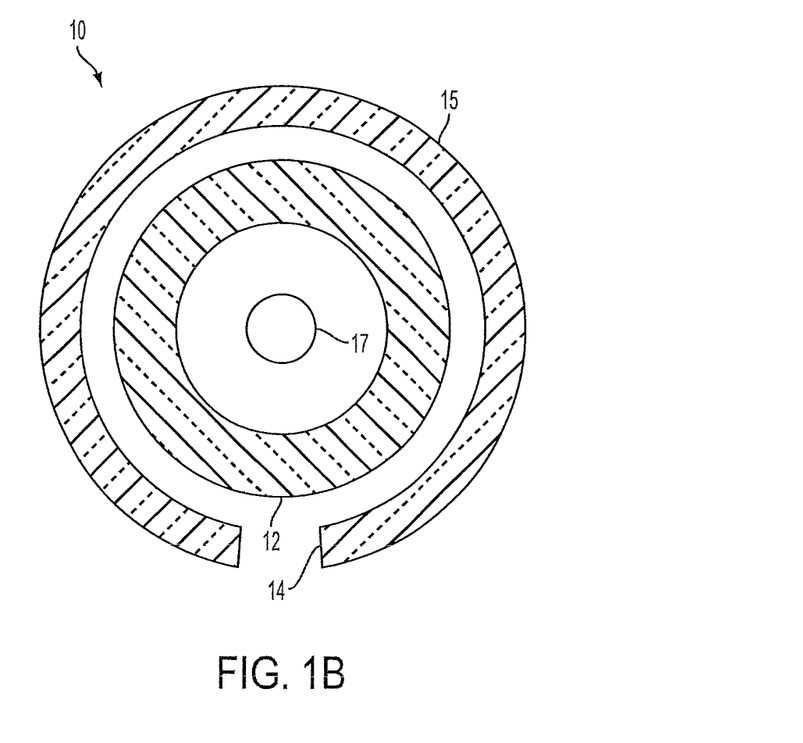
FIG. 1B is a cross-sectional view taken along the direction of line 2-2 in FIG. 1A to illustrate an example of a conventional powder vaporizer and distributor assembly.

FIG. 1B is a cross-sectional view, taken along the section line 2-2 of FIG. 1A, of one example of a conventional powder vaporizer and distributor assembly 10. The vaporizer 12 is constructed as a heated tubular permeable member. It is formed of a resistive material which can be heated by the AC power source 29 and vaporizes, for example, a CdS or CdTe semiconductor material powder transported by the carrier gas into vaporizer 12 through injection ports 17, 19. The distributor 15 is a housing formed of a thermal-conductive material, for example, graphite or mullite, which is heated by radiant heat from vaporizer 12 and/or from another source. The housing of distributor 15 surrounds vaporizer 12 to capture CdS or CdTe semiconductor material vapor that diffuses through the walls of vaporizer 12. The semiconductor material vapor is directed by distributor towards a slot or series of holes 14 which face a surface of a substrate 13, which moves past the distributor 50. More detailed examples of VTD systems of the type illustrated can be found in U.S. Pat. Nos. 5,945,163, 5,945,165, 6,037,241, and 7,780,787, all assigned to First Solar, Inc.

Vaporization of powder material is often incomplete, causing clogging and deterioration of the vaporizer and distributor assembly 10. This problem may be compounded when certain depositions introduce a dopant into the semiconductor material which can react with semiconductor material and form a solid phase compound and a vapor phase compound within vaporizer 12 during the deposition process. For example, to dope a CdTe material, a process gas, such as compressed dry air, is also introduced into the vaporizer 12 to provide a reactive mix with the dopant, the latter of which is provided in the CdTe powder mix. Introduction of the dopant and process gas into vaporizer 12 can cause formation of a gas phase product and a solid phase product. While the gas can pass through the porous walls of vaporizer 12 for deposition on a substrate 13, the solid cannot and is confined within the vaporizer causing increased vaporizer pore clogging. A major hindrance to efficient and cost effective production of cadmium sulfide (CdS) or cadmium telluride (CdTe) thin films using a VTD system is the complete shut-down of production for maintenance or repair of the vaporizer and distributor assembly 10. Complete shut-downs of production for such maintenance or repair can be costly and time consuming.

An improved vapor transport deposition system which mitigates against the noted problems and which can better control the vapor applied to a substrate is desirable.

DETAILED DESCRIPTION OF THE INVENTION

In the following detailed description, reference is made to the accompanying drawings which form a part hereof, and which illustrate specific embodiments of the invention. These embodiments are described in sufficient detail to enable those of ordinary skill in the art to make and use them. It is also understood that structural, logical, or procedural changes may be made to the specific embodiments disclosed herein without departing from the spirit or scope of the invention.

According to an exemplary embodiment, an improved vapor transport deposition method and system are provided which include a distributor coupled to two vaporizers with improved seals located at the juncture between each vaporizer and the distributor. The distributor may employ a thermal conductive material and be heated by radiant heat from the two vaporizers and/or from other sources. Each respective vaporizer can independently vaporize or sublimate a raw material powder into a raw material vapor and the two vapors may diffuse out of the respective vaporizers, through the seals and into separate chambers within the distributor. The two raw material vapors are then separately directed out of the respective distributor chambers for co-deposition on a substrate as a thin film layer. This example embodiment may further include at least two powder feeders for providing vaporizable powders to the respective vaporizers. A first powder feeder may be loaded with a first vaporizable material and a second powder feeder may be loaded with the same vaporizable material. At least two carrier gas sources may provide a carrier gas, for example Helium (He), into respective powder feeders to transport the respective vaporizable material powders from the powder feeders into the respective vaporizers.

Each of the two vaporizers, in conjunction with its respective powder feeder and carrier gas source, is controlled independently. Independent control allows the vaporizers to operate concurrently or one in relief of the other. Concurrent operation of both vaporizers increase throughput of vaporizable material for increased deposition speed. Operation of only one of the multiple vaporizers at a time allows for redundancy within the VTD system. If the first vaporizer requires maintenance, repair or cleaning, it can be stopped while the second vaporizer either continues vaporization or is activated to relieve the first vaporizer. Since the second vaporizer sources, respectively provide a carrier gas to material feeders 43a, 43b and 44a, 44b through mass flow controllers 47a, 47b and 48a, 48b to transport the raw material through respective vaporizer inlets 41a, 42a and 41b, 42b into respective vaporizer units 40a, 40b. Mass flow controllers 47a, 47b and 48a, 48b regulate the flow of carrier gas through respective material feeders 43a, 43b and 44a, 44b, which in turn controls the flow rate of semiconductor material powder into respective vaporizer units 40a, 40b and the flow rate of vaporizable material vapor into distributor unit 50.

The seals located at the juncture between each vaporizer and the distributor may include a tubular portion which can be inserted into an opening in the respective vaporizer and an L-shaped portion that extends over the edge of the vaporizer opening and into a corresponding opening in the distributor. The seals provide for a secure connection between each vaporizer and the distributor, reducing the loss of vapor as it is directed from the vaporizer into the distributor. This also improves VTD system production and efficiency.

This improved vapor transport deposition method and system can be used to deposit any vaporizable material or combinations of vaporizable materials. For example, the various vaporizable materials may include but are not limited to semiconductor materials, semiconductor alloys, combinations of multiple semiconductor materials, a combination of a semiconductor material and a dopant, or a combination of multiple semiconductor materials and/or dopant. Vaporizable semiconductor materials may, for example, include copper indium gallium selenide (CIGS) or a transition metal (Group 12) combined with a chalcogenide (Group 18) such as cadmium telluride (CdTe), cadmium sulfide (CdS), zinc telluride (ZnTe) or zinc sulfide (ZnS). Suitable vaporizable dopants may include Si, $CuCl_2$ or $MnCl_2$. Suitable semiconductor alloys may include $Cd_xZn_{1-x}Te$, $CdTe_xS_{1-x}$, or phase change material such as GeSbTe.

Figure 2:
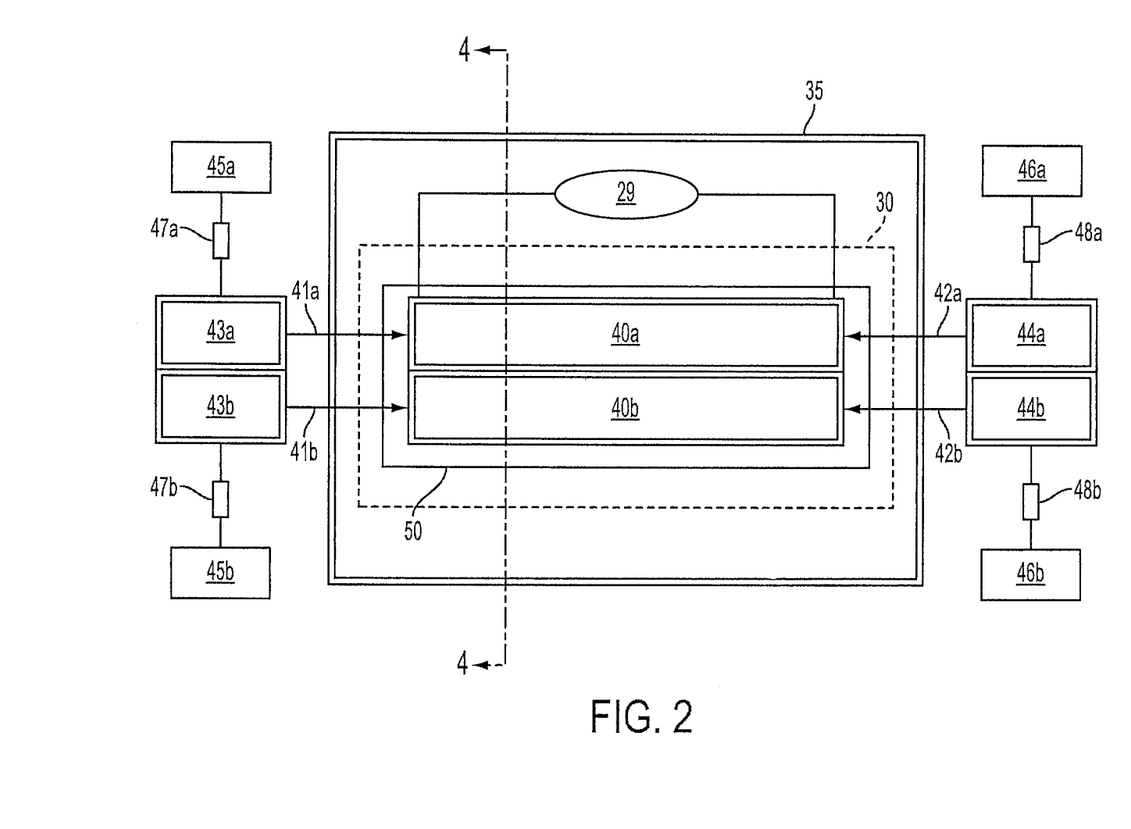
FIG. 2 is a schematic of an embodiment of a vapor transport deposition (VTD) system.

FIG. 2 illustrates an embodiment of a deposition system that includes multiple vaporizers attached to a common distributor for continuous deposition of materials onto a substrate 13 (FIG. 3), for example, a glass substrate used in the manufacture of thin film solar modules. The deposition system includes a vaporizer and distributor assembly 30, which is housed within a vacuum vessel 35. Vaporizer and distributor assembly 30 includes a pair of vaporizer units 40a, 40b coupled to a distributor unit 50 and having respective vaporizer inlets 41a, 42a and 41b, 42b at opposite ends for receiving vaporizable material powders from respective material feeders 43a, 43b and 44a, 44b. Inert carrier gas sources 45a, 46a, and 45b, 46b, for example Helium gas (He) sources, respectively provide a carrier gas to material feeders 43a, 43b and 44a, 44b through mass flow controllers 47a, 47b and 48a, 48b to transport the raw material through respective vaporizer inlets 41a, 42a and 41b, 42b into respective vaporizer units 40a, 40b. Mass flow controllers 47a, 47b and 48a, 48b regulate the flow of carrier gas through respective material feeders 43a, 43b and 44a, 44b, which in turn controls the flow rate of semiconductor material powder into respective vaporizer units 40a, 40b and the flow rate of vaporizable material vapor into distributor unit 50.

Material feeders 43a, 43b and 44a, 44b may be any type of material supplier that can be utilized for processing the raw material in a powder form and feeding the material powder into the vaporizer and distributor assembly 30, for example, vibratory powder feeders, fluidized bed feeders and rotary disk feeders that are commercially available. The vibration speed and/or amplitude used to process the raw material powder can also be used to control flow of raw material from material feeders 43a, 43b and 44a, 44b through respective vaporization units 40a, 40b and to the vaporizer and distributor assembly 30. The vibration speed and/or amplitude of the material feeders 43a, 43b and 44a, 44b and the flow rate of mass flow controllers 47a, 47b and 48a, 48b may be adjusted by a manual input or a digital/analog signal.

The inert carrier gases input from inert carrier gas sources 45a, 46a, and 45b, 46b can alternatively be another inert gas such as nitrogen, neon, argon or krypton, or combinations of these gases. It is also possible for the carrier gas to be mixed with and include some amount of a reactive gas such as oxygen that can advantageously affect growth properties of the material. A flow rate of about 0.1 to about 10 slpm of the carrier gas has been determined to be sufficient to facilitate flow of the powder out of material feeders 43a, 43b and 44a, 44b, through vaporization units 40a, 40b and through the vaporizer and distributor assembly 30. Mass flow controllers 47a, 47b, 48a, 48b may adjust flow rate between about 0.1 to about 10 slpm during the deposition process to control the thickness and/or composition of the deposited film.

Figure 3:
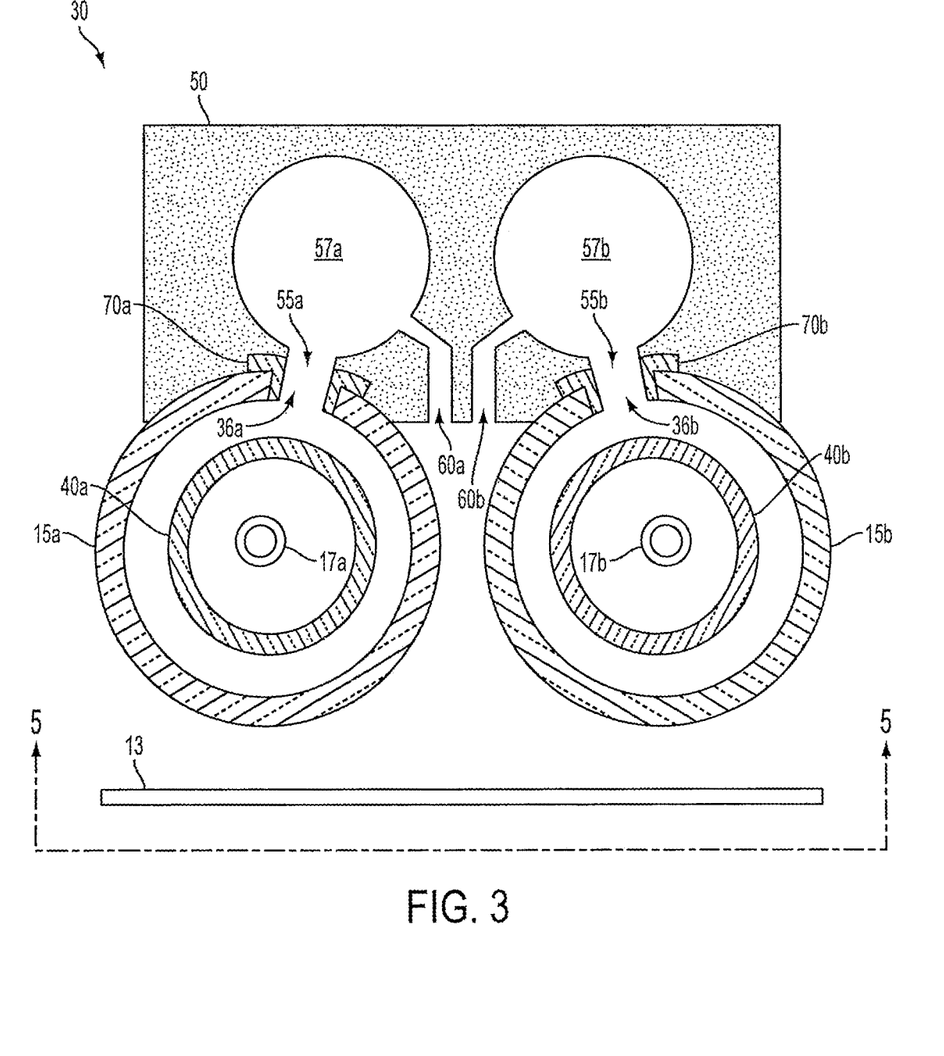
FIG. 3 is a cross-sectional view taken along the direction of line 4-4 in FIG. 2 to illustrate an example of the FIG. 2 vaporizer and distributor assembly embodiment.
Figure 4:
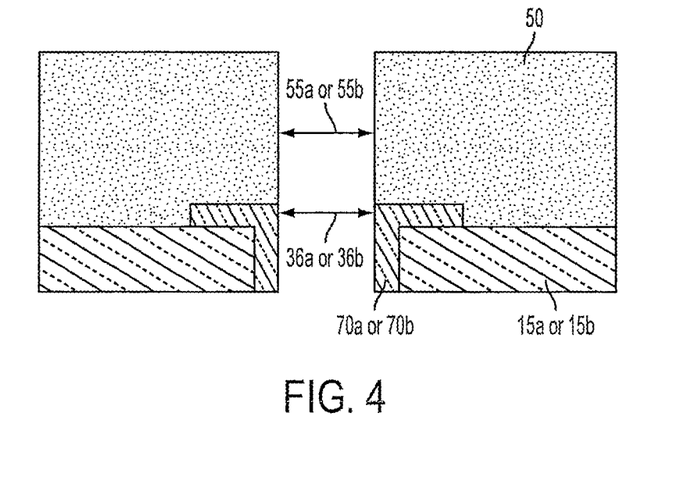
FIG. 4 is an enlarged view of the L-shaped seal at the junction of the vaporizer and the distributor in the vaporizer and distributor assembly.

FIG. 3 illustrates a cross sectional view of the vaporizer and distributor assembly 30 in FIG. 2, taken along the section line 4-4. As shown in FIG. 3, vaporizer units 40a, 40b are enclosed within and coupled to the common distributor unit 50. Vaporizer units 40a, 40b are comprised respectively of permeable tubular walls, which are formed of a resistive material heated by AC power source 29 (FIG. 2) and which vaporize material powder carried by an inert gas, e.g. Helium gas (He), alone or mixed with a reactive gas, from inlets 41a, 41b, 42a, 42b through respective injection ports 17a, 17b. Distributor unit 50 comprises respective vapor housings 15a, 15b, formed of a thermal-conductive material, for example, graphite, or insulator, for example, mullite, which is heated by radiant heat from vaporizers 40a and 40b and/or from an external source. The respective vapor housings 15a, 15b, enclose respective vaporizer units 40a, 40b to capture material vapor that diffuses through the permeable tubular walls of vaporizer units 40a, 40b. Vaporized material is directed within the respective vapor housings 15a, 15b, out of respective openings 36a, 36b and through respective channels 55a, 55b to distributor chambers 57a, 57b in distributor unit 50. Respective L-shaped seals 70a, 70b, which are also illustrated in greater detail in FIG. 4, insert into respective opening 36a, 36b of respective vapor housings 15a, 15b and extend into distributor unit 50. L-shaped seals 70a, 70b may be formed of a thermal-conductive material, for example, graphite, or insulator, for example, mullite and may withstand temperatures up to about 1200° C. Vaporized material collected in chambers 57a, 57b from respective vaporizer units 40a, 40b are then directed towards openings 60a, 60b, which may each be configured as a long slit opening or a plurality of spaced openings along the distributor 50, which direct the respective material vapor out of the distributor unit 50 to be deposited onto a substrate 13.

The vaporizer units 40a, 40b are made of any permeable material that is preferably electrically conductive, such as silicon carbide, and heated by AC power 29 to provide for vaporization or sublimation of material. Furthermore, the vapor housings 15a, 15b are generally a tubular shape that encloses the vaporizer units 40a, 40b as illustrated in FIG. 3.

Vaporizers 40a and 40b provide radiant heat to the surface of distributor unit 50 sufficient to maintain a temperature of about 900 to about 1200° C. in the distributor chambers 57a, 57b. Thermal insulation may also be applied to the top of distributor unit 50 to maintain the desired temperature in the distributor chambers 57a, 57b. Vapor pressure within distributor chambers 57a, 57b is between about 1 to about 10 Torr.

Figure 5A:
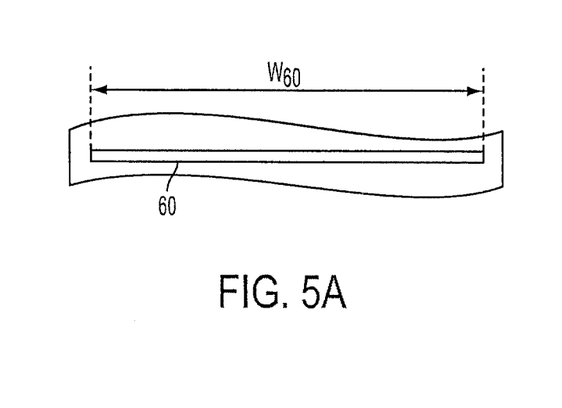
FIG. 5 is a bottom plane view taken along the direction of line 5-5 of FIG. 3 to illustrate a varying size slit opening of the apparatus.
Figure 5B:
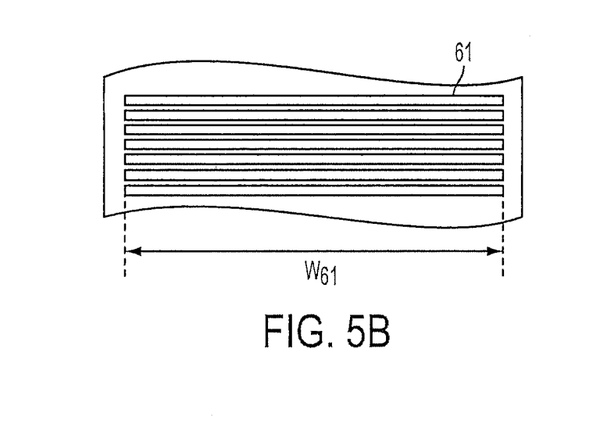
Figure 5C:
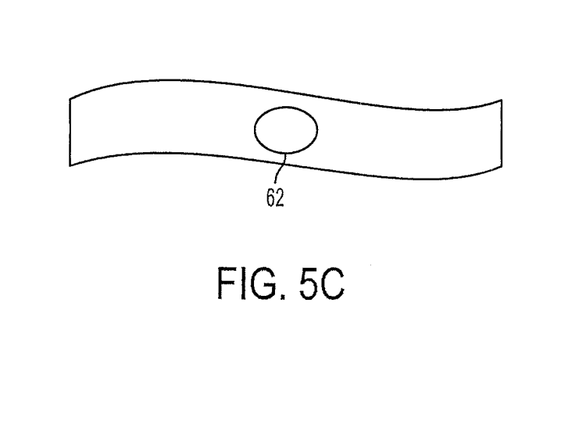
Figure 5D:
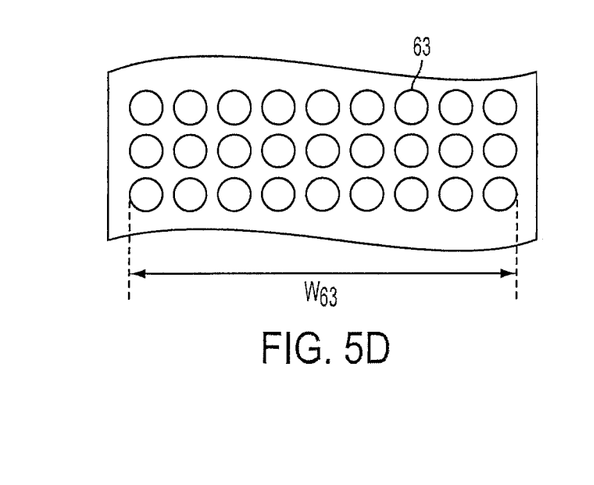

The openings 60a, 60b for directing the combination material vapor out of the respective distributor chambers 57a, 57b may be a slit 64, as shown in FIG. 5A, a plurality of slits 61, as shown in FIG. 5B, a single hole 62, as shown in FIG. 5C, or a plurality of holes 63, as shown in FIG. 5D. The slits 64, 61 may extend along the base of the distributor unit 50 between and/or parallel to vapor housings 15a, 15b. As shown in FIG. 5B, the plurality of slits 61 may each have the same width $W_{61}$. In other embodiments, the plurality slits 61 may have different widths $W_{61}$ from each other. The plurality of slits 61 may be parallel to each other. The holes 62, 63 of FIGS. 5C and 5D may be circular, oblong, square, rectangular, or other regular or irregular shapes. The single hole 62, as shown in FIG. 5C, may be placed centrally in the base of the distributor unit 50 between vapor housings 15a, 15b. The plurality of holes 63 may be evenly spaced along the base of the distributor unit 50 between vapor housings 15a, 15b. The plurality of holes 63 may be arranged in a plurality of rows and columns, as shown in FIG. 5D. In another embodiment, the plurality of holes 63 may be arranged in a single row. In various embodiments, the width of the single slit $W_{64}$, the width of the plurality of slits $W_{61}$, and the width of the plurality of slits $W_{63}$, may be sized to shorter than the width of the substrate 13 to deposit material on less than the entire substrate 13.

As described above, independent control of vaporizer units 40a, 40b in conjunction with respective feeders 43a, 43b and 44a, 44b and carrier gas sources 45a, 45b and 46a, 46b allows the vaporizer units 40a, 40b to operate concurrently or in relief of one another. Concurrent operation of vaporizer units 40a, 40b increase throughput of vaporizable material for increased deposition speed. Independent throughput of respective vaporizer units 40a, 40b, may be controlled by using respective mass flow controllers 47a, 47b, and 48a, 48b to independently adjust vaporized material flow rate as described above. Operation of only one of vaporizer units 40a, 40b at a time allows for redundancy within the VTD system. If vaporizer unit 40a, or corresponding material feeders 43a, 44a, carrier gas sources 45a, 46a, or mass flow controllers 47a, 48a, require repair or maintenance, vaporizer unit 40a can be shut down, while vaporizer unit 40b and corresponding material feeders 43b, 44b, carrier gas sources 45b, 46b, or mass flow controllers 47b, 48b continue to operate, allowing continuous semiconductor thin film layer production. If vaporizer unit 40b, or corresponding material feeders 43b, 44b, carrier gas sources 45b, 46b, or mass flow controllers 47b, 48b, require repair or maintenance, vaporizer unit 40b can be shut down while vaporizer unit 40a and corresponding material feeders 43a, 44a, carrier gas sources 45a, 46a, or mass flow controllers 47a, 48a continue to operate, also allowing continuous thin film layer production. This continuous VTD system production is more efficient and cost effective.

Figure 6:
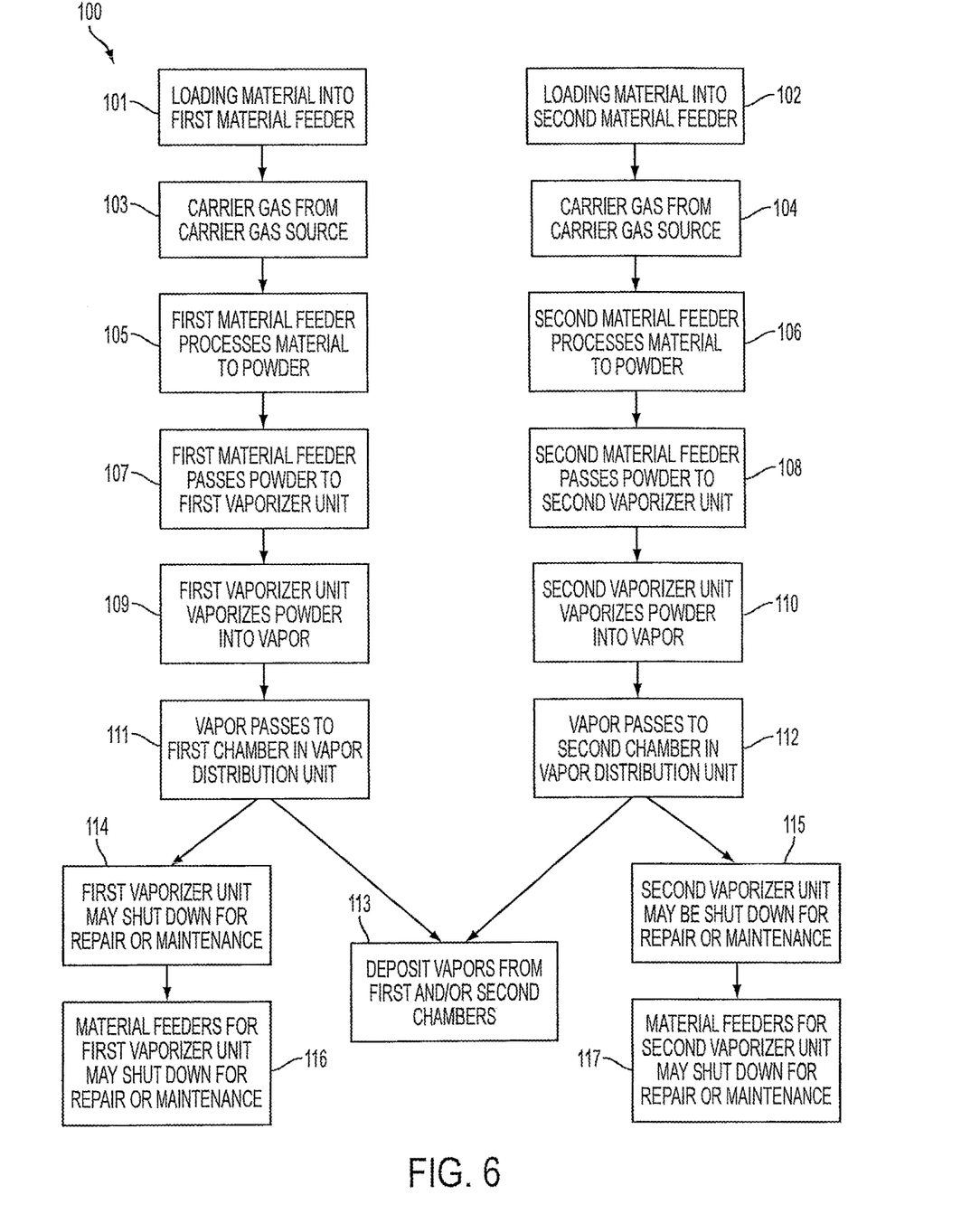
FIG. 6 illustrates a method 100 for continuous deposition of semiconductor material as a layer on a substrate using a VTD system with a vaporizer and distributor assembly.

A method 100 for continuous deposition of vapor material as a layer on a substrate using a VTD system with a vaporizer and distributor assembly as described herein, is shown in FIG. 6. As described above, multiple material feeders are used to process material into powder and feed it into the vaporizer units of the vaporizer and distributor assembly. In method 100, steps 101, 103, 105, 107, 109 and 111 pertain to using a first material feeder to provide vaporizable material through a first inlet into a first vaporizer unit. Steps 102, 104, 106, 108, 110 and 112 pertain to using a second material feeder to provide a different vaporizable material through a second inlet into a second vaporizer unit. Though not described as separate steps of method 100 or shown in FIG. 6, at least two additional material feeders, as shown in FIG. 2, may be used as needed to process and feed additional material into third and/or forth inlets on opposite ends of the first and second vaporizer units of the vaporizer and distributor assembly by following steps 101-112.

At steps 101 and 102, material is loaded into the vibratory powder feeder of a first and/or second material feeder. At steps 103 and 104, respective carrier gas sources provide respective carrier gases to respective first and/or second material feeders. The respective material feeders are used to process the material into a powder at steps 105 and 106. At steps 107 and 108, the respective material feeders are used to pass the carrier gas and the material powder into respective vaporizer units. The respective vaporizer units are used to vaporize the respective material powder into respective material vapors at steps 109 and 110. At steps 111 and 112, the respective material vapors are passed from the respective vaporizer units into separate chambers of the common distributor unit. At step 113, the distributor unit is used to separately deposit the material vapor collected in the respective distributor chambers onto a substrate. At step 114, if the first vaporizer unit requires repair or maintenance, the first material feeder and the first vaporizer unit are turned off while the second material feeder and the second vaporizer unit remain in operation, maintaining continuous VTD system production of thin film layers. At step 115, if the second vaporizer unit requires repair or maintenance, the second material feeder and the second vaporizer unit are turned off while the first material feeder and the first vaporizer unit remain in operation, maintaining continuous VTD system production of thin film layers. At step 116, if one of the material feeders being used to process and feed additional material into the first vaporizer unit requires repair or maintenance, that feeder is turned off and the second feeder continues to feed material into the first vaporizer unit, maintaining continuous VTD system production of thin film layers. At step 117, if one of the material feeders being used to process and feed additional material into the second vaporizer unit requires repair or maintenance, that feeder is turned off and the second feeder continues to feed material into the second vaporizer unit, maintaining continuous VTD system production of thin film layers.

While embodiments have been described in detail, it should be readily understood that the invention is not limited to the disclosed embodiments. Rather the embodiments can be modified to incorporate any number of variations, alterations, substitutions, or equivalent arrangements not heretofore described without departing from the spirit and scope of the invention.

What is claimed as new and desired to be protected by Letters Patent of the United States is:

1. A vapor distributing unit comprising:
   a vaporizer unit for vaporizing a powder material;
   a vapor housing for capturing material vapor from the vaporizer unit, wherein the vaporizer unit is within the vapor housing, and wherein the vapor housing further comprises a vapor housing outlet;
   a vapor distribution unit comprising an inlet channel for collecting vapor from the vaporizer unit, a chamber for collecting the material vapor captured by the vapor housing, and a chamber outlet for outputting the material vapor collected in the chamber along a base of the vapor distribution unit;
   a seal at the junction between an outer wall of the vapor housing and the vapor distribution unit, wherein the seal comprises:
      a tubular section that extends from the outer wall of the vapor housing to flush with an inner wall of the vapor housing, the inner wall arranged opposite of the outer wall, the tubular section forming a continuous wall of the inlet channel and extending from the vapor housing to the chamber; and
      a second section that extends away from the inlet channel into an annular space between the vapor housing and the vapor distribution unit.

2. The vapor distributing unit of claim 1, wherein the vaporizer unit further comprises:
   a permeable member having at least one material inlet port for receiving the powder material.

3. The vapor distributing unit of claim 1, wherein the inlet channel in the vapor distribution unit is between the vapor housing and the chamber.

4. The vapor distributing unit of claim 1, wherein the seal is an L-shaped seal.

5. The vapor distributing unit of claim 4, wherein the seal comprises a thermal-conductive material.

6. The vapor distributing unit of claim 5, wherein the seal comprises graphite.

7. The vapor distributing unit of claim 4, wherein the vapor distribution unit comprises a thermal-conductive material.

8. The vapor distributing unit of claim 4, wherein the vapor distribution unit comprises graphite.

9. The vapor distributing unit of claim 4, wherein the vapor distribution unit comprises a thermal-conductive block.

10. The vapor distributing unit of claim 4, wherein the vapor housing comprises a thermal-conductive material.

11. The vapor distributing unit of claim 4, wherein the vapor housing comprises graphite.

12. The vapor distributing unit of claim 4, further comprising a vibration powder feeder for feeding the powder material into an inlet port of the vaporizer unit.

13. The vapor distributing unit of claim 12, further comprising a second vibration powder feeder for feeding a second powder material into a second inlet port of the vaporizer unit.

14. The vapor distributing unit of claim 13, further comprising a first gas source for directing gas through a first mass flow controller into the first vibration powder feeder, and a second gas source for directing gas through a second mass flow controller into the second vibration powder feeder.

15. The vapor distributing unit of claim 14, wherein the first and second powder materials are a semiconductor powder material.

16. The vapor distributing unit of claim 15, wherein the semiconductor powder material is CdTe.

17. The vapor distributing unit of claim 14, wherein the first powder material and the second powder material are a mixture of a semiconductor material and a dopant.

18. The vapor distributing unit of claim 17, wherein the semiconductor powder material is CdTe and the dopant comprises Si.

19. The vapor distributing unit of claim 14, wherein the gas is a carrier gas.

20. The vapor distributing unit of claim 14, wherein the gas is a mixture of a carrier gas and a reactive gas.

* * * * *